United States Patent
Lin et al.

(10) Patent No.: US 9,800,265 B2
(45) Date of Patent: Oct. 24, 2017

(54) DATA SERIALIZATION CIRCUIT

(71) Applicant: Novatek Microelectronics Corp., Hsinchu (TW)

(72) Inventors: Shih-Chun Lin, Kaohsiung (TW); Ren-Hong Luo, Hsinchu (TW); Mu-Jung Chen, Tainan (TW); Yung-Cheng Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/409,478

(22) Filed: Jan. 18, 2017

(65) Prior Publication Data

US 2017/0279461 A1   Sep. 28, 2017

Related U.S. Application Data

(60) Provisional application No. 62/313,821, filed on Mar. 28, 2016.

(51) Int. Cl.
| | |
|---|---|
| *H03M 9/00* | (2006.01) |
| *H03K 5/01* | (2006.01) |
| *H03K 3/037* | (2006.01) |
| *H03K 5/00* | (2006.01) |

(52) U.S. Cl.
CPC .............. *H03M 9/00* (2013.01); *H03K 3/037* (2013.01); *H03K 5/01* (2013.01); *H03K 2005/00019* (2013.01)

(58) Field of Classification Search
CPC ........... H03M 9/00; H03K 3/037; H03K 5/01; H03K 2005/00019

USPC ......................................................... 341/101
See application file for complete search history.

(56) References Cited

U.S. PATENT DOCUMENTS

| | | | | |
|---|---|---|---|---|
| 5,349,612 A | * | 9/1994 | Guo | H03K 5/135 327/270 |
| 5,982,309 A | | 11/1999 | Xi et al. | |
| 6,031,473 A | * | 2/2000 | Kubinec | H03M 9/00 341/100 |
| 6,677,793 B1 | * | 1/2004 | Joshi | H03L 7/0805 327/158 |
| 7,468,685 B1 | * | 12/2008 | Macaluso | H03M 9/00 327/408 |
| 7,551,107 B2 | | 6/2009 | Shim et al. | |
| 8,198,930 B2 | | 6/2012 | Zerbe et al. | |
| 8,436,670 B2 | | 5/2013 | Ma et al. | |

(Continued)

*Primary Examiner* — Brian Young
(74) *Attorney, Agent, or Firm* — JCIPRNET

(57) ABSTRACT

The data serialization circuit includes a delay circuit, a data serializer, a first data sampler and a second data sampler. The delay circuit receives an input clock signal and generates a plurality of delayed clock signals. The delayed clock signals includes a first delayed clock signal generated by a first delay stage and a second delayed clock signal generated by a second delay stage. The data serializer receives parallel data and a final stage delayed clock signal of the delayed clock signals, and converts the parallel data into serial data according to the final stage delayed clock signal. Wherein, the first data sampler samples the serial data according to the first delayed clock signal to generate a first output serial data, and the second data sampler samples the first output serial data according to the second delayed clock signal to generate a second output serial data.

21 Claims, 3 Drawing Sheets

(56) References Cited

U.S. PATENT DOCUMENTS 8,823,562 B2 9/2014 Suzuki
8,836,384 B1 9/2014 Oh et al.

\* cited by examiner

DATA SERIALIZATION CIRCUIT

CROSS-REFERENCE TO RELATED APPLICATION

This application claims the priority benefits of U.S. provisional application Ser. No. 62/313,821, filed on Mar. 28, 2016. The entirety of the above-mentioned patent application is hereby incorporated by reference herein and made a part of this specification.

BACKGROUND

Field of the Invention

The invention is directed to a data serialization circuit and more particularly, to the data serialization circuit with lower jitter re-sampling scheme.

Description of Related Art

In conventional art, a plurality of clock trees are necessary for an integrated circuit (IC). The clock trees are used to provide a plurality of clock signals to a core circuit of the IC. The core circuit can sample data by using the clock signals. Under a noisy power and/or ground environment, jitter of each of the clock signals increases according to number of delay stages of the clock tree for generating each of the clock signals. As a result, size of a window of an eye diagram corresponding to data sampled by the clock signal with higher jitter is reduced. Quality of the sampled data declines correspondingly.

SUMMARY

The invention provides a plurality of data serialization circuits for lower jitter of sampled data.

The invention is directed to the data serialization circuit including a delay circuit, a data serializer, a first data sampler and a second data sampler. The delay circuit includes a plurality of delay stages, receives an input clock signal and generates a plurality of delayed clock signals. The delay stages include a first delay stage and a second delayed stage prior to the first delay stage. The delayed clock signals include a first delayed clock signal generated by the first delay stage and a second delayed clock signal generated by the second delay stage. The data serializer is coupled to the delay circuit. The data serializer is receives parallel data and a final stage delayed clock signal of the delayed clock signals, and converts the parallel data into serial data according to the final stage delayed clock signal. The first data sampler and a second data sampler are coupled in series, and are coupled to the delay circuit and the data serializer. Wherein, the first data sampler samples the serial data according to the first delayed clock signal to generate a first output serial data, and the second data sampler samples the first output serial data according to the second delayed clock signal to generate a second output serial data.

The invention is also directed to another data serialization circuit including a delay circuit, a data serializer, a plurality of data samplers and an output decision circuit. The delay circuit includes a plurality of delay stages, receives an input clock signal and generates a plurality of delayed clock signals. The delay stages include a first delay stage and a second delayed stage prior to the first delay stage. The delayed clock signals include a first delayed clock signal generated by the first delay stage and a second delayed clock signal generated by the second delay stage. The data serializer is coupled to the delay circuit, receives parallel data and the first delayed clock signal of the delayed clock signals, and converts the parallel data into serial data according to the first delayed clock signal. The data samplers are coupled to the delay circuit, wherein, the data samplers respectively sample input serial data to generate a plurality of sampled serial data according to a plurality of sampling clock signals. The output decision circuit is coupled to the data samplers, receives the plurality of sampled serial data and selects one of the plurality of sampled serial data to be an output serial data according to the plurality of sampled serial data.

In an embodiment of the invention, wherein the output decision circuit includes a transition detection circuit, a voting circuit, a clock selection circuit and a selector. The transition detection circuit is coupled to the data samplers, receives the plurality of sampled serial data and determines which one of the sampling clock signals hits transition regions of the serial data by monitoring the plurality of sampled serial data to generate detection information. The voting circuit is coupled to the transition detection circuit, receives a plurality of the detection information and determines a majority of the plurality of the detection information to generate a voting result. The clock selection circuit is coupled to the voting circuit, and generates a selecting signal according to the voting result. The selector is coupled to the clock selection circuit and the data samplers, and selects one of the plurality of sampled serial data to be as the output serial data according to the selecting signal.

To sum up, the invention provides a plurality of data samplers for re-sampling the serial data to generate the output serial data. The serial data is generated according to a delayed clock signal, and the data samplers re-sample the serial data according to another delayed clock signal(s) prior to the delayed clock signal. Such as that, jitter of the output serial data can be reduced, and quality of the output serial data can be improved.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
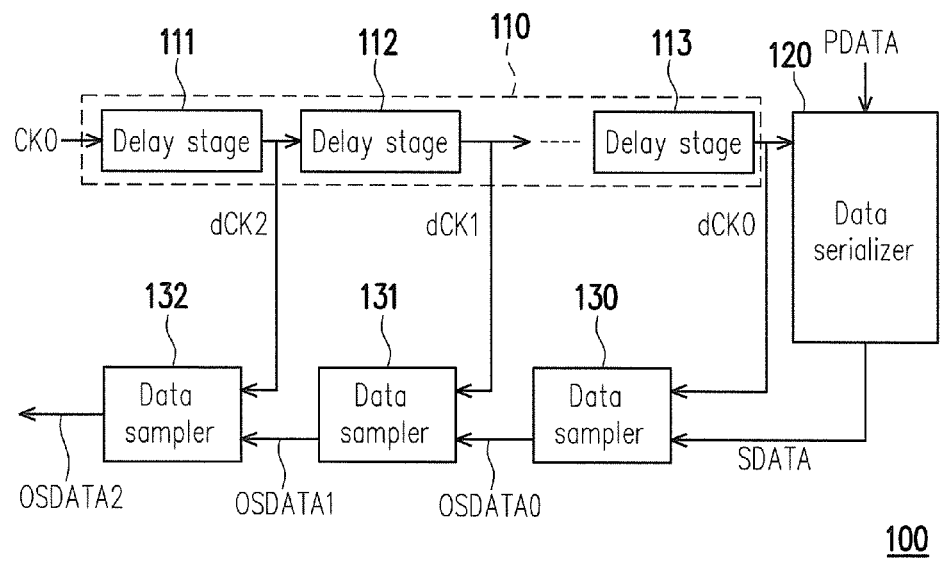
FIG. 1 illustrates a schematic diagram of a data serialization circuit according to an embodiment of present disclosure.

Please refer to FIG. 1, which illustrates a schematic diagram of a data serialization circuit 100 according to an embodiment of present disclosure. The data serialization circuit 100 includes a delay circuit 110, a data serializer 120 and data samplers 130-132. The delay circuit 110 receives an input clock signal CK0 and generates a plurality of delayed clock signals dCK2-dCK0 by delaying the input clock signal CK0 sequentially. The delay circuit 110 includes a plurality of delay stages, such as three delay stages 111-113 as an example shown in FIG. 1. Wherein, the delay stages 111-113 are coupled in series, and respectively generate the delayed clock signals dCK2-dCK0. In this embodiment, the delayed clock signals dCK2 is prior to the delayed clock signals dCK1, and the delayed clock signals dCK1 is prior to the delayed clock signals dCK0. The delay stage 113 is a final delay stage and the delayed clock signal dCK0 is a final stage delayed clock signal.

It can be seen, since the delayed clock signals dCK2 is prior to the delayed clock signals dCK1 and the delayed clock signals dCK1 is prior to the delayed clock signals dCK0, jitter of the delayed clock signals dCK2 is less than jitter of the delayed clock signals dCK1, and jitter of the delayed clock signals dCK1 is less than jitter of the delayed clock signals dCK0.

Each of the delay stages 111-113 can be implemented by one or more logic buffers. Or, in some embodiments, each of the delay stages 111-113 can be implemented by any other component which can delay a periodic signal.

The data serializer 120 is coupled to the delay circuit 110, and receives the delayed clock signals dCK0 generated by the delay stage 113 which is a final stage of the delay stages 111-113. The data serializer 120 also receives parallel data PDATA and converts the parallel data PDATA into serial data SDATA according to the final stage delayed clock signal (i.e., the delayed clock signals dCK0).

The data serializer 120 can be implemented by any parallel signal to serial signal converting circuit well known by a person skilled in the art. For example, the data serializer 120 may pre-store the parallel data PDATA into a shift register, and shift out the parallel data PDATA in the shift register to generate the serial data SDATA according to the delayed clock signals dCK0.

The data samplers 130-132 are coupled to the data serializer 120 in series. The data sampler 130 receives the serial data SDATA from the data serializer 120, and receives the delayed clock signals dCK0. The data sampler 130 samples the serial data SDATA according to the delayed clock signal dCK0 to generate an output serial data OSDATA0. The data sampler 131 is coupled to the data sampler 130, and receives the output serial data OSDATA0 and the delayed clock signal dCK1. The data sampler 131 samples the output serial data OSDATA0 according to the delayed clock signal dCK1 to generate an output serial data OSDATA1. Further, the data sampler 132 is coupled to the data sampler 131, and receives the output serial data OSDATA1 and the delayed clock signal dCK2. The data sampler 132 samples the output serial data OSDATA1 according to the delayed clock signal dCK2 to generate an output serial data OSDATA2.

In the present embodiment, the data serialization circuit 100 samples the serial data SDATA by the data samplers 130-132 according to the delayed clock signals dCK0-dCK2 in sequence. As can be seen from a prior delay stage to a later delay stage, the jitter of the delayed clock signals increases gradually. On the other side, as seen from the later delay stage to the prior delay stage, the jitter of the delayed clock signals are regarded as decreasing gradually. Since jitter of the delayed clock signal dCK1 generated by the relatively prior delay stage 112 is smaller than jitter of the final stage delayed clock signal dCK0 generated by the final delay stage 113, jitter of the output serial data OSDATA1 may be smaller than jitter of the output serial data OSDATA0 generated by using the final stage delayed clock signal dCK0 having large jitter. Similarly, since jitter of the delayed clock signal dCK2 generated by the relatively prior delay stage 111 is smaller than jitter of the delayed clock signal dCK1 generated by the relatively later delay stage 112, jitter of the output serial data OSDATA2 may be even smaller than the jitter of the output serial data OSDATA1. In other words, the jitter of the output serial data OSDATA0-OSDATA2 can decrease gradually by using the delayed clock signals which have gradually smaller jitter to do sampling.

Figure 2:
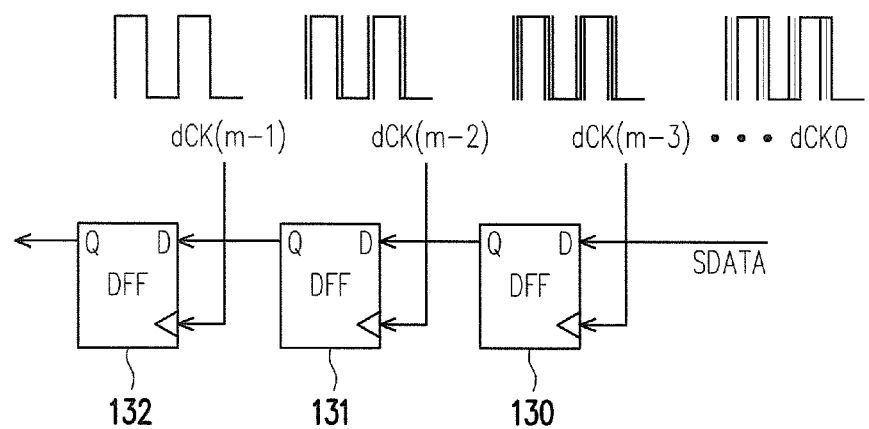
FIG. 2 illustrates a relationship diagram between the delays clock signals and the data samplers according to an embodiment of present disclosure.

Please refer to FIG. 2, which illustrates a relationship diagram between the delayed clock signals and the data samplers according to an embodiment of present disclosure. In FIG. 2, delayed clock signals dCK(m−1), dCK(m−2) and dCK(m−3) are respectively generated by different middle delay stages of the delay circuit 110 which has a plurality of delay stages, and a delayed clock signal dCK0 is a final stage delayed clock signal generated by the final delay stage of the delay circuit 110, wherein m is an integer larger than 3. A middle delay stage, as it is called, is not the final delay stage of the delay circuit 110. In FIG. 2, the data samplers 130-132 may be implemented by D-type flip-flops (DFF). The data samplers 130-132 may sample received serial data according to the delayed clock signals dCK(m−3), dCK(m−2) and dCK(m−1), respectively. FIG. 2 illustrates an embodiment that the serial data is sampled by using delayed clock signals not including the final stage delayed clock signal. From a prior delay stage to a later delay stage, the jitter of the delayed clock signals increases gradually. That is, as seen from the later delay stage to the prior delay stage, the jitter of the delayed clock signals decreases gradually. Such as that, the jitter of the sampled serial data generated by the data samplers 130-132 decreases gradually as a result of using the delayed clock signals which have gradually smaller jitter to do sampling. In another embodiment, the data sampler 130 may firstly sample the serial data SDATA according to the final stage delayed clock signal dCK0 and subsequently sample the serial data according to middle stage delayed clock signals (such as the example in FIG. 1).

Figure 3:
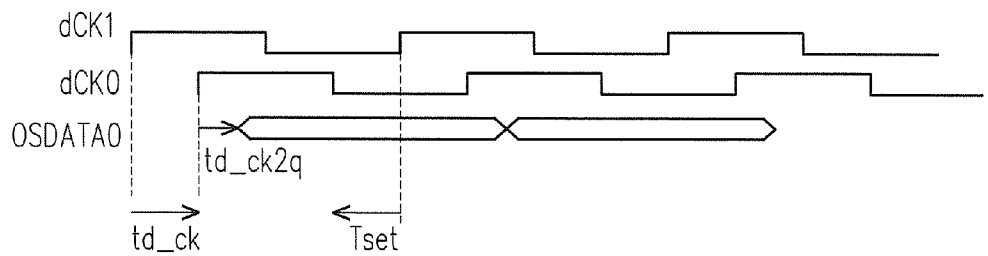
FIG. 3 illustrates a waveform diagram of the delayed clock signals and the serial data according to an embodiment of present disclosure.

Please refer to FIG. 3, which illustrates a waveform diagram of the delayed clock signals and the serial data according to an embodiment of present disclosure. A relationship of timing parameters between the data sampler 130 and the data sampler 131 of FIG. 1 can be shown as formula (1) shown as below:

$$T-(td\_ck+td\_ck2q)-T_{jitter}>T_{set} \qquad (1)$$

Wherein, T is a period of the delayed clock signal dCK1, td_ck is a delay between the delayed clock signal dCK1 and the delayed clock signal dCK0, td_ck2q is a gate delay of the data sampler 130, $T_{jitter}$ is a timing range of accumulated jitter, and $T_{set}$ is a setup time of the data sampler 131. Another two middle stage delayed clock signals such as dCK(m−2) and dCK(m−3) shown in FIG. 2 may be presented in the same waveforms as the waveforms of the delayed clock signals dCK1 and dCK0 in FIG. 3, and the relationship of timing parameters is similar.

Figure 4:
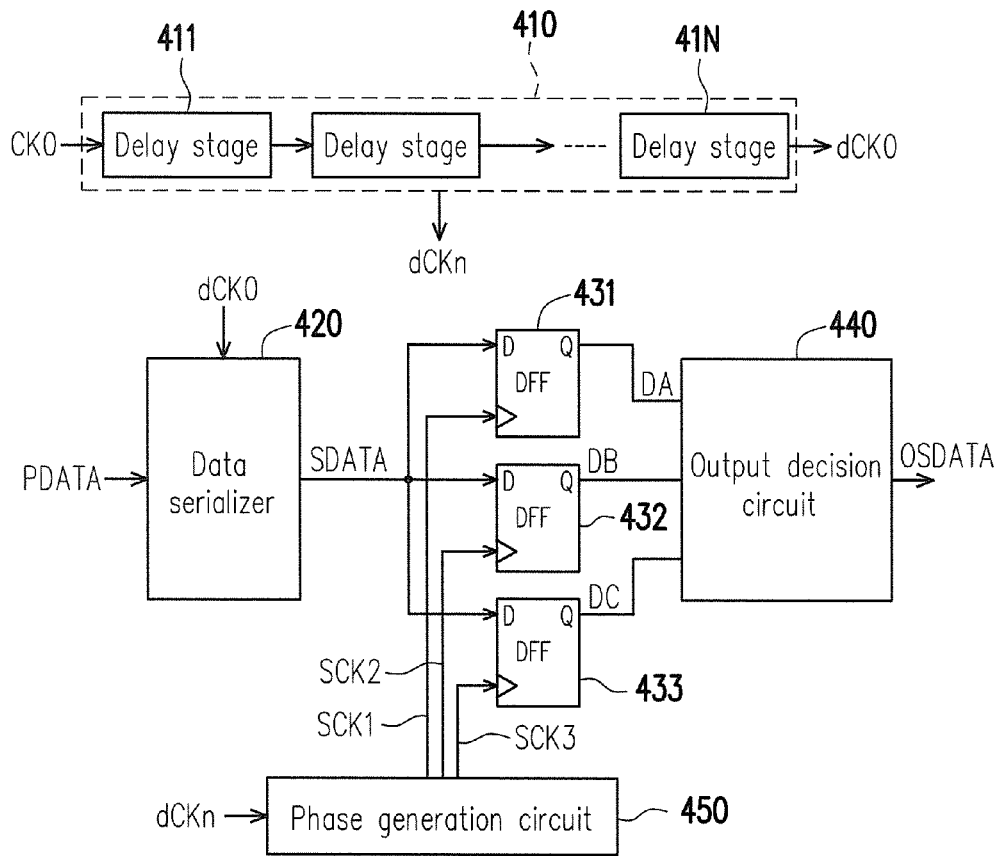
FIG. 4 illustrates a schematic diagram of a data serialization circuit according to another embodiment of present disclosure.

Please refer to FIG. 4, which illustrates a schematic diagram of a data serialization circuit according to another embodiment of present disclosure. The data serialization circuit 400 includes a delay circuit 410, a data serializer 420, data samplers (implemented as D flip-flops, DFF) 431-433, an output decision circuit 440 and a phase generation circuit 450. The delay circuit 410 includes a plurality of delay stages 411-41N, receives an input clock signal CK0 and delays the input clock signal CK0 to generate a plurality of delayed clock signals, including a middle stage delayed clock signal dCKn and a final stage delayed clock signal dCK0. The delayed clock signals dCK0 is transported to the data serilaizer 420, and the data serilaizer 420 converts received parallel data PDATA to serial data SDATA according to the delayed clock signals dCK0. The delayed clock signal dCKn is generated by one of middle stages of the delay stage 411-41N, and may be transported to the phase generation circuit 450. The phase generation circuit 450 may generate sampling clock signals SCK1-SCK3 according to the delayed clock signal dCKn. The sampling clock signals SCK1-SCK3 generated by the phase generation circuit 450 have the same period but different phases, the sampling clock signal SCK2 lags behind the sampling clock signal SCK1, and the sampling clock signal SCK3 lags behind the sampling clock signal SCK2.

It should be noted here, in some embodiment, the phase generation circuit 450 is not necessary. The sampling clock signals SCK1-SCK3 may be obtained by selecting three of the middle stage delayed clock signals generated by the delay circuit 410. The sampling clock signal SCK2 lags behind the sampling clock signal SCK1, and the sampling clock signal SCK3 lags behind the sampling clock signal SCK2. A delay between the sampling clock signals SCK1 and SCK2, and a delay between the sampling clock signals SCK2 and SCK3 can be determined according to a data transmission rate of the serial data SDATA. A relationship between the delay between two sampling clock signals used by two neighboring data samplers and the data transmission rate can be referred to formula (1). In some embodiments, the sampling clock signals SCK1-SCK3 may be selected from three consecutively neighboring middle delay stages of the delay circuit 410.

The data samplers 431-433 are respectively formed by three D-type flip-flops (DFF). The data samplers 431-433 receive the serial data SDATA commonly, sample the serial data SDATA according to the sampling clock signals SCK1-SCK3 respectively, and generate sampled serial data DA, DB and DC, respectively. The output decision circuit 440 receives the sampled serial data DA, DB and DC and selects one of the plurality of sampled serial data DA, DB and DC to be an output serial data OSDATA according to the sampled serial data DA, DB and DC.

Figure 7:
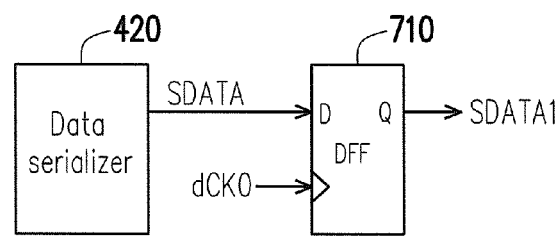
FIG. 7 illustrates a schematic diagram of a scheme for generating a serial data to be sampled by the data samplers according to an embodiment of present disclosure.

In one embodiment, the data samplers 431-433 do not directly receive the serial data SDATA outputted from the data serializer 420 but receive a sampled serial data, as referred to FIG. 7. FIG. 7 illustrates a schematic diagram of a scheme for generating a serial data to be sampled by the data samplers according to an embodiment of present disclosure. In FIG. 7, the serial data SDATA that the data serializer 420 generates is not directly sent to the data samplers 431-433. The data serializer 420 sends the serial data SDATA to an initial stage data sampler 710. The initial stage data sampler 710 samples the serial data SDATA initially to generate an input serial data SDATA1 according to the delayed clock signal dCK0 (which may be the final stage delayed clock signal generated by the final delay stage of the delay circuit 410). The input serial data SDATA1 is fed to the data samplers 431-433. A relationship between timing parameters of the initial stage data sampler 710 and the plurality of data samplers 431-433 can be referred to formula (1). Besides, the initial stage data sampler 710 may be a D-type flip-flop.

Figure 5:
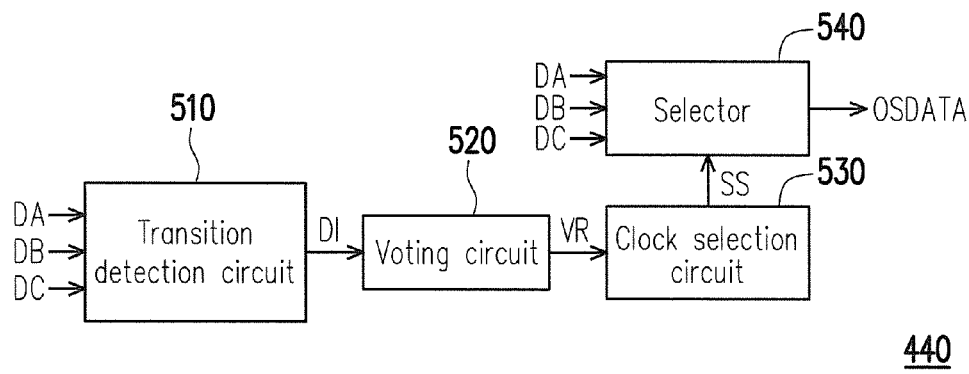
FIG. 5 illustrates a schematic diagram of the output decision circuit according to an embodiment of present disclosure.
Figure 6:
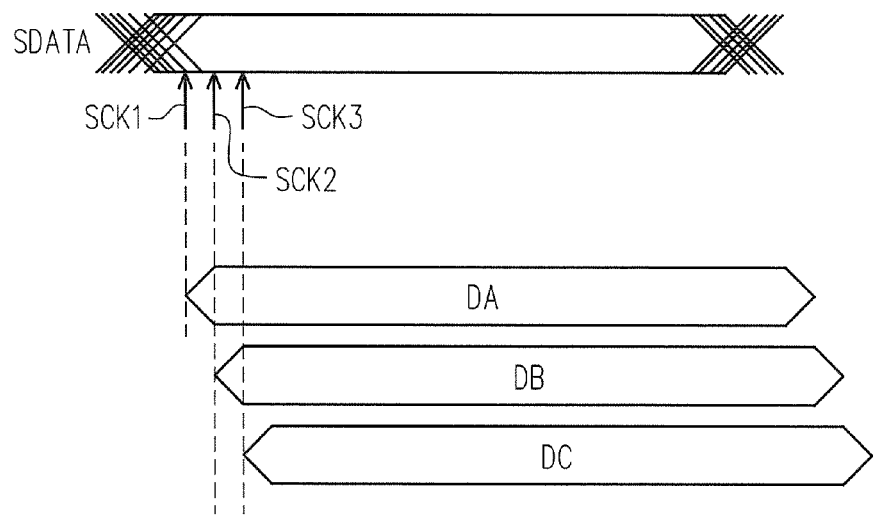
FIG. 6 illustrates a waveform diagram of the transition detection circuit according to an embodiment of present disclosure.

In detail operation of the output decision circuit 440, the output decision circuit 440 may select one of the plurality of sampled serial data DA, DB and DC to be as the output serial data OSDATA according to logic states of the plurality of sampled serial data DA, DB and DC. Please refer to FIG. 5, which illustrates a schematic diagram of the output decision circuit according to an embodiment of present disclosure. In FIG. 5, the output decision circuit 440 includes a transition detection circuit 510, a voting circuit 520, a clock selection circuit 530 and a selector 540. The transition detection circuit 510 is coupled to the data samplers 431-433, receives the sampled serial data DA, DB and DC and determines which one of the sampling clock signals SCK1-SCK3 hits transition regions of the serial data SDATA by monitoring the plurality of sampled serial data DA, DB and DC to generate detection information DI. By referring to FIG. 6, which illustrates a waveform diagram of the transition detection circuit according to an embodiment of present disclosure. The serial data SDATA is respectively sampled at transition edges (rising edges and/or falling edges) of the sampling clock signals SCK1-SCK3, and three (or more) sampled serial data DA, DB and DC can be obtained. Take the sampling clock signal SCK1 for example. If the sampling clock signal SCK1 hit a logic high region of the serial data SDATA, the sampled serial data DA with logic "1" can be obtained, and if the sampling clock signal SCK1 hit a logic low region of the serial data SDATA, the sampled serial data DA with logic "0" can be obtained.

It can be seen, when logic levels of the first, second, and third sampled serial data DA, DB and DC are the same, the detection information DI indicates a first event; when the logic level of the first sampled serial data DA is different from the logic levels of the second sampled serial data DB and the third sampled serial data DC, the detection information DI indicates a second event; and, when the logic level of the third sampled serial data DC is different from the logic levels of the first sampled serial data DA and the second sampled serial data DB, the detection information DI indicates a third event. Wherein, the first event indicates the transition region of the serial data SDATA is not hit by any of the sampling clock signals SCK1-SCK3, the second event indicates to the transition region is hit by the first sampling clock signal SCK1, and the third event indicates the transition region is hit by the third sampling clock signal SCK3.

That is, the transition detection circuit 510 may generate the detection information DI according to the sampled serial data DA, DB and DC by reference to a Table 1 shown as below. In Table 1, "No transition" is the first event, "SCK1 hits data transition" is the second event, and "SCK3 hits data transition" is the third event.

TABLE 1

| DA | DB | DC | Detection information DI |
|---|---|---|---|
| 0 | 0 | 0 | No transition |
| 0 | 0 | 1 | SCK3 hits data transition |
| 0 | 1 | 0 | Don't Care |
| 0 | 1 | 1 | SCK1 hits data transition |
| 1 | 0 | 0 | SCK1 hits data transition |
| 1 | 0 | 1 | Don't Care |
| 1 | 1 | 0 | SCK3 hits data transition |
| 1 | 1 | 1 | No transition |

Please be noted here, in the Table 1, some unreasonable sampled serial data set with (DA, DB, DC)=(1, 0, 1) and (0, 1, 0) may be found. It means that operation of the transition detection circuit 510 at that time is abnormal. Such as that, the detection information DI is set to be "Don't care" by the transition detection circuit 510 corresponding to the abnormal status.

The voting circuit 520 is coupled to the transition detection circuit 510, and receives a plurality of the detection information DI during a predetermined time period for a majority voting operation. The voting circuit 520 is used to determine a majority of the plurality of the detection information to generate a voting result VR.

In detail, during the time period of the majority voting operation, the voting circuit 520 may accumulate a first value in response to the detection information indicating the first event ("No transition"), accumulate a second value in response to the detection information indicating the second event ("SCK1 hits data transition"), and accumulate a third value in response to the detection information indicating the third event ("SCK3 hits data transition"), according to the plurality of detection information DI. After the majority voting operation is completed, the first value indicates the number of times that the first event occurs, the second value indicates the number of times that the second event occurs, and the third value indicating the number of times that the third event occurs. The voting circuit 520 may determine, among the three events, an event that occurs the maximum number of times according to the first to the third values, after the majority voting operation. The voting result VR indicates the determined event that occurs the maximum number of times during the majority voting operation. In other words, the voting circuit 520 may generate the voting result VR based on one of the first to third values which is corresponding to the event that occurs the maximum number of times.

The clock selection circuit 530 is coupled to the voting circuit 520 and the selector 540. The clock selection circuit 530 receives the voting result VR, generates a selecting signal SS according to the voting result VR, and outputs the selecting signal SS to control the selector 540 to selectively outputs one of the sampled serial data DA, DB and DC to be as the output serial data OSDATA. The selecting signal SS may have three different values respectively corresponding to the voting result VR indicating the first event, the second event and the third event. In detail, if the voting result VR indicates the first event ("No transition"), the selecting signal SS may control the selector 540 to output the sampled serial data DB that is sampled by using the sampling clock signal SCK2 to be as the output serial data OSDATA; if the voting result VR indicates the second event ("SCK1 hits data transition"), the selecting signal SS may control the selector 540 to output the sampled serial data DC that is sampled by using the sampling clock signal SCK3 to be as the output serial data OSDATA; and, if the voting result VR indicates the third event ("SCK3 hits data transition"), the selecting signal SS may control the selector 540 to output the sampled serial data DA that is sampled by using the sampling clock signal SCK1 to be as the output serial data OSDATA.

The transition detection circuit 510, the clock selection circuit 530, and the selector 540 may be implemented by a plurality of logic gates. A design of the logic gates can be implemented according to a truth table built based on the Table 1. The voting circuit 520 may include counters, and the counters respectively correspond to the events, and each of the counters is used to accumulate the value according to the corresponding detection information DI. The voting circuit 520 may further include a comparator to decide the maximum one of the values for generating the voting result VR.

To conclusion, the present disclosure provides a plurality of data samplers for re-sampling the serial data to generate the output serial data. The serial data is generated according to a delayed clock signal, and the data samplers re-sample the serial data according to another delayed clock signal(s) prior to the delayed clock signal. By selecting proper delayed clock signals, jitter of the output serial data can reduce, and quality of the output serial data can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A data serialization circuit, comprising:
a delay circuit comprising a plurality of delay stages, receiving an input clock signal and generating a plurality of delayed clock signals, the delay stages comprising a first delay stage and a second delayed stage prior to the first delay stage, and the delayed clock signals comprising a first delayed clock signal generated by the first delay stage and a second delayed clock signal generated by the second delay stage;
a data serializer, coupled to the delay circuit, receiving parallel data and a final stage delayed clock signal of the delayed clock signals, and converting the parallel data into serial data according to the final stage delayed clock signal; and
a first data sampler and a second data sampler, coupled in series, and coupled to the delay circuit and the data serializer,
wherein, the first data sampler samples the serial data according to the first delayed clock signal to generate a first output serial data, and the second data sampler samples the first output serial data according to the second delayed clock signal to generate a second output serial data.

2. The data serialization circuit according to claim 1, wherein the first delay stage is a final delay stage of the delay circuit, and the first delayed clock signal is the final stage delayed clock signal.

3. The data serialization circuit according to claim 1, wherein the first delay stage and the second delay stage are middle delay stages prior to a final delay stage of the delay circuit.

4. The data serialization circuit according to claim 1, wherein a relationship of timing parameters between the first data sampler and the second data sampler is:

$$T-(td\_ck+td\_ck2q)-T_{jitter}>T_{set},$$

wherein, T is a period of the first delayed clock signal, $td\_ck$ is a delay between the first delayed clock signal and the second delayed clock signal, $td\_ck2q$ is a gate delay of the first data sampler, $T_{jitter}$ is a timing range of accumulated jitter, and $T_{set}$ is a setup time of the second data sampler.

5. The data serialization circuit according to claim 1, further comprising a third data sampler, coupled to the second data sampler, and sampling the second output serial data according to a third delayed clock signal to generate a third output serial data, wherein the third delayed clock signal is generated by a third delay stage of the delay circuit prior to the second delay stage.

6. The data serialization circuit according to claim 1, wherein jitter in the first output serial data generated by the first data sampler is larger than jitter in the second output serial data generated by the second data sampler.

7. The data serialization circuit according to claim 1, wherein each of the data samplers is a D-type flip flop.

8. A data serialization circuit, comprising:
   a delay circuit comprising a plurality of delay stages, receiving an input clock signal and generating a plurality of delayed clock signals, the delay stages comprising a first delay stage and a second delayed stage prior to the first delay stage, and the delayed clock signals comprising a first delayed clock signal generated by the first delay stage and a second delayed clock signal generated by the second delay stage;
   a data serializer, coupled to the delay circuit, receiving parallel data and the first delayed clock signal of the delayed clock signals, and converting the parallel data into serial data according to the first delayed clock signal;
   a plurality of data samplers, coupled to the delay circuit, wherein, the data samplers respectively sample input serial data to generate a plurality of sampled serial data according to a plurality of sampling clock signals; and
   an output decision circuit, coupled to the data samplers, receiving the plurality of sampled serial data and selecting one of the plurality of sampled serial data to be an output serial data according to the plurality of sampled serial data.

9. The data serialization circuit according to claim 8, wherein the data samplers are coupled to the data serializer and the input serial data is the serial data generated by the data serializer.

10. The data serialization circuit according to claim 8, further comprising an initial stage data sampler, coupled to the data serializer and sampling the serial data according to the first delayed clock signal to generate the input serial data.

11. The data serialization circuit according to claim 10, wherein a relationship of timing parameters between the initial stage data sampler and the plurality of data samplers is:

$$T-(td\_ck+td\_ck2q)-T_{jitter}>T_{set},$$

wherein, T is a period of the first delayed clock signal, td_ck is a delay between the first delayed clock signal and the second delayed clock signal, td_ck2q is a gate delay of the initial stage data sampler, Tjitter is a timing range of accumulated jitter, and Tset is a setup time of each of the data samplers.

12. The data serialization circuit according to claim 8, further comprising a phase generation circuit, coupled to the second delay stage of the delay circuit, and generating at least one of the plurality of sampling clock signals based on the second delayed clock signal.

13. The data serialization circuit according to claim 12, wherein the second delayed clock signal is used as one of the plurality of sampling clock signals.

14. The data serialization circuit according to claim 8, wherein a plurality of delayed clock signals generated by part of the delay stages of the delay circuit are used as the plurality of sampling clock signals.

15. The data serialization circuit according to claim 8, wherein the output decision circuit selects one of the plurality of sampled serial data to be as the output serial data according to logic states of the plurality of sampled serial data.

16. The data serialization circuit according to claim 8, wherein the output decision circuit comprises:
   a transition detection circuit, coupled to the data samplers, receiving the plurality of sampled serial data and determining which one of the sampling clock signals hits transition regions of the serial data by monitoring the plurality of sampled serial data to generate detection information;
   a voting circuit, coupled to the transition detection circuit, receiving a plurality of the detection information and determining a majority of the plurality of the detection information to generate a voting result;
   a clock selection circuit, coupled to the voting circuit, and generating a selecting signal according to the voting result; and
   a selector, coupled to the clock selection circuit and the data samplers, and selecting one of the plurality of sampled serial data to be as the output serial data according to the selecting signal.

17. The data serialization circuit according to claim 16, wherein the data samplers comprises a first data sampler, a second data sampler, and a third data sampler, the plurality of sampled serial data comprises a first sampled serial data, a second sampled serial data, and a third sampled serial data, and the plurality of sampling clock signals have the same period but different phases and comprise a first sampling clock signal for the first data sampler, a second sampling clock signal for the second data sampler, lagging behind the first sampling clock signal, and a third sampling clock signal for the third data sampler, lagging behind the second sampling clock signal.

18. The data serialization circuit according to claim 17, wherein when logic levels of the first, second, and third sampled serial data are the same, the detection information indicates a first event, when the logic level of the first sampled serial data is different from the logic levels of the second sampled serial data and the third sampled serial data, the detection information indicates a second event, when the logic level of the third sampled serial data is different from the logic levels of the first sampled serial data and the second sampled serial data, the detection information indicates a third event,
   wherein, the first event indicates the transition region is not hit, the second event indicates to the transition region is hit by the first sampling clock signal, and the third event indicates the transition region is hit by the third sampling clock signal.

19. The data serialization circuit according to claim 18, wherein the voting circuit, during a counting time period, accumulates a first value when the detection information indicates the first event, accumulates a second value when the detection information indicates the second event, accumulates a third value when the detection information indicates the third event, and at the end of the counting time period, the voting circuit generates the voting result based on one of the first to third values which is corresponding to an event that occurs the maximum number of times.

20. The data serialization circuit according to claim 19, wherein if the voting result indicates the first event, the selector selects the second sampled serial data to be as the output serial data, if the voting result indicates the second event, the selector selects the third sampled serial data to be as the output serial data, and if the voting result indicates the third event, the selector selects the first sampled serial data to be as the output serial data.

21. The data serialization circuit according to claim 8, wherein each of the data samplers is a D-type flip flop.

\* \* \* \* \*